(12) United States Patent
Won et al.

(10) Patent No.: US 10,480,075 B2
(45) Date of Patent: Nov. 19, 2019

(54) GRAPHENE SYNTHESIS CHAMBER AND METHOD OF SYNTHESIZING GRAPHENE BY USING THE SAME

(71) Applicants: NPS Corporation, Hwaseong-si (KR); HANWHA AEROSPACE CO., LTD, Changwon-si (KR)

(72) Inventors: Dong-kwan Won, Changwon (KR); Won-Sik Nam, Hwaseong (KR)

(73) Assignees: NPS Corporation, Hwaseong-si (KR); HANWHA AEROSPACE CO., LTD., Changwon-si (KR)

( * ) Notice: Subject to any disclaimer, the term of this patent is extended or adjusted under 35 U.S.C. 154(b) by 222 days.

(21) Appl. No.: 15/611,280

(22) Filed: Jun. 1, 2017

(65) Prior Publication Data

US 2017/0268108 A1    Sep. 21, 2017

Related U.S. Application Data

(63) Continuation of application No. 13/416,071, filed on Mar. 9, 2012, now abandoned.

(30) Foreign Application Priority Data

Mar. 17, 2011 (KR) .................. 10-2011-0023829
Jul. 13, 2011 (KR) .................. 10-2011-0069490

(51) Int. Cl.
*C23C 16/46* (2006.01)
*C23C 16/26* (2006.01)
(Continued)

(52) U.S. Cl.
CPC .............. *C23C 16/46* (2013.01); *B82Y 40/00* (2013.01); *C23C 16/26* (2013.01); *C23C 16/482* (2013.01); *C23C 16/545* (2013.01)

(58) Field of Classification Search
CPC ....... C23C 16/46; C23C 16/26; C23C 16/482; C23C 16/545; B82Y 40/00
See application file for complete search history.

(56) References Cited

U.S. PATENT DOCUMENTS 4,763,601 A    8/1988  Saida et al.
5,280,156 A *  1/1994  Niori ................ H01L 21/67103
                                                        118/725
(Continued)

FOREIGN PATENT DOCUMENTS

KR          10-0286325 B1    5/2001
KR       10-2009-0065206 A    6/2009
(Continued)

OTHER PUBLICATIONS

Communication dated Jun. 5, 2018, issued by the Korean Intellectual Property Office in counterpart Korean Application No. 10-2018-0033497.
(Continued)

*Primary Examiner* — Kelly M Gambetta
(74) *Attorney, Agent, or Firm* — Sughrue Mion, PLLC

(57) ABSTRACT

A graphene synthesis chamber includes: a chamber case in which a substrate including a metal thin film is placed; a gas supply unit which supplies at least one gas comprising a carbon gas into an inner space of the chamber case; a main heating unit which emits at least one light to the inner space to heat the substrate; and at least one auxiliary heating unit which absorbs the at least one light and emits radiant heat toward the substrate.

7 Claims, 12 Drawing Sheets

(51) Int. Cl.
 *C23C 16/54* (2006.01)
 *B82Y 40/00* (2011.01)
 *C23C 16/48* (2006.01)

(56) References Cited

U.S. PATENT DOCUMENTS

| | | | |
|---|---|---|---|
| 5,306,895 | A | 4/1994 | Ushikoshi et al. |
| 5,392,100 | A | 2/1995 | Yoshida |
| 6,015,526 | A | 1/2000 | Ruiter |
| 6,025,575 | A * | 2/2000 | Park ............... C23C 16/45565 118/725 |
| 6,867,841 | B2 | 3/2005 | Nakasu et al. |
| 7,160,531 | B1 | 1/2007 | Jacques et al. |
| 2009/0110627 | A1 * | 4/2009 | Choi ............... B82Y 30/00 423/447.1 |
| 2010/0260933 | A1 | 10/2010 | Malecki et al. |
| 2010/0310766 | A1 | 12/2010 | Armour et al. |
| 2011/0100955 | A1 | 5/2011 | Pushparaj et al. |
| 2011/0123776 | A1 | 5/2011 | Shin et al. |
| 2011/0143034 | A1 * | 6/2011 | Ahn ............... B82Y 30/00 427/249.6 |
| 2011/0195207 | A1 | 8/2011 | Hong et al. |
| 2012/0256166 | A1 | 10/2012 | Chen et al. |

FOREIGN PATENT DOCUMENTS

| | | |
|---|---|---|
| KR | 10-2011-0020444 A | 3/2011 |
| KR | 10-2011-0053012 A | 5/2011 |
| KR | 10-2011-0066608 A | 6/2011 |

OTHER PUBLICATIONS

Communication dated Jul. 31, 2017 issued by the Korean Intellectual Property Office in counterpart Korean Patent Application No. 10-2011-0023829.

Z. Juang, et al; "Graphene synthesis by chemical vapor deposition and transfer by a roll-to-roll process"; Carbon; vol. 48; 2010; pp. 3169-3174; 6 pgs. total.

* cited by examiner

GRAPHENE SYNTHESIS CHAMBER AND METHOD OF SYNTHESIZING GRAPHENE BY USING THE SAME

This is a Continuation application of U.S. application Ser. No. 13/416,071 filed Mar. 9, 2012, claiming priority from Korean Patent Application No. 10-2011-0023829, filed on Mar. 17, 2011, and Korean Patent Application No. 10-2011-0069490, filed on Jul. 13, 2011, the contents of all of which are incorporated herein by reference in their entirety.

BACKGROUND

1. Field

Apparatuses and method consistent with exemplary embodiments relate to a graphene synthesis chamber and synthesizing graphene by using the same.

2. Description of the Related Art

In general, graphite is a stack of two-dimensional (2D) graphene sheets having a plate shape in which carbon atoms are connected to one another in a hexagonal shape. After examining graphene peeled off from graphite, it has been found recently that graphene has very useful properties that are different from those of existing materials.

One remarkable property of graphene is that when electrons move therein, the electrons move as if the mass of the electrons is zero. This means that the electrons move at a speed at which light travels in vacuum, that is, at the speed of light. Graphene exhibits an abnormal half-integer quantum Hall effect with respect to electrons and holes, and also has a high electron mobility ranging from about 20,000 to about 50,000 $cm^2$/Vs.

In order to synthesize graphene, chemical vapor deposition (CVD) is used. CVD is a method of synthesizing graphene on a surface of a metal thin film by putting the metal thin film formed of a catalytic metal such as copper or platinum in an inner space of a graphene synthesis chamber, injecting hydrocarbon such as methane or ethane into the inner space of the graphene synthesis chamber, and heating the inner space of the graphene synthesis chamber at a high temperature.

Although graphene has very useful properties as described above, since it takes a relatively long time to set a high-temperature/high-vacuum environment in order to synthesize graphene, it is difficult to mass produce large graphene sheets at low costs.

SUMMARY

One or more exemplary embodiments provide a graphene synthesis chamber allowing easy thermal control.

According to one aspect of an exemplary embodiment, there is provided a graphene synthesis chamber including: a chamber case in which a substrate including a metal thin film is placed; a gas supply unit which supplies at least one gas comprising a carbon gas into an inner space of the chamber case; a main heating unit which emits at least one light to the inner space to heat the substrate; and at least one auxiliary heating unit which absorbs the at least one light and emits radiant heat toward the substrate.

The at least one auxiliary heating unit may be disposed parallel to at least one of a first surface and a second surface of the substrate.

The at least one auxiliary heating unit may include: a first auxiliary heating portion which faces a first surface of the substrate; and a second auxiliary heating portion which faces a second surface, opposite to the first surface, of the substrate.

The first auxiliary heating portion may be spaced apart from the substrate.

The gas supply unit may be disposed at a first side of an auxiliary space formed by the first auxiliary heating portion and the second auxiliary heating portion in the inner space, and may supply the at least one gas into the auxiliary space.

The graphene synthesis chamber may further include a gas discharge unit which is disposed at second side of the auxiliary space and discharge the at least one gas flowing through the auxiliary space to an outside.

The main heating unit may include: a halogen lamp; and a window which is disposed in a direction in which the halogen lamp emits the at least one light or surrounds an outer circumference of the halogen lamp.

The at least one light may include a near-infrared wavelength band light, and at least one of a mid-infrared wavelength band light and a visible wavelength band light, wherein the at least one gas may further include at least one of an inert gas and a non-reactive gas which is heated by at least one of the three lights.

The main heating unit may be disposed on at least one of a central region of the chamber case and a region adjacent to an inner surface of the chamber case, wherein the at least one auxiliary heating unit is a plurality of auxiliary heating units disposed parallel to the inner surface of the chamber case.

The chamber case may be a polyhedron.

The graphene synthesis chamber may further include at least one barrier wall which divides the inner space of the chamber case into at least two spaces, wherein the at least one gas may further include at least one of an inert gas and a non-reactive gas which is heated by the at least one light, in a first space of the at least two spaces, and the at least one auxiliary heating unit may be disposed in a second space of the at least two spaces where the carbon gas is heated by the at least one light and the radiant heat.

The at least one light may include a near-infrared wavelength band light, a mid-infrared wavelength band light and a visible wavelength band light, wherein the at least one of the inert gas and the non-reactive gas is heated by at least one of the three lights, and the carbon gas is heated by at least one of the three lights and the radiant heat to form graphene on the substrate.

The chamber case may further include: a metal thin film inlet/outlet through which the substrate is introduced into the chamber case, and the substrate on which graphene is formed is output from the chamber case, wherein the metal thin film inlet/outlet may include at least one gap which closes in a vacuum state on the inner space of the chamber case, and opens when the substrate on which the graphene is formed passes through the chamber case.

A first gap among the at least one gap may be disposed at a side where the substrate is introduced into the chamber case, and the first gap may be substantially equal to a thickness of the substrate before the graphene is formed thereon.

A second gap may be disposed at a side where the substrate on which the graphene is formed is output from the chamber case, and the second gap may be substantially equal to a sum of thicknesses of the graphene and the substrate.

The metal thin film inlet/outlet may include rotating members which roll the substrate into the chamber. The rotating members may linearly contact the substrate when the substrate moves in the first gap.

Surfaces of the rotating members contacting the metal thin film of the substrate may include a material having a hardness less than a hardness of the metal thin film.

The graphene synthesis chamber may further include loadlock chambers which are disposed outside the chamber case with the at least one gap between the loadlock chambers and the chamber case.

The graphene synthesis chamber may further include metal thin film protecting units which are disposed in the chamber case and protect portions of the substrate from the gas, wherein the portions of the substrate are wound around rollers The metal thin film protecting units may include a material that evaporates at a temperature higher than a temperature at which the graphene is formed on the substrate.

BRIEF DESCRIPTION OF THE DRAWINGS

The above and other aspects will become more apparent by describing in detail exemplary embodiments thereof with reference to the attached drawings, in which.

DETAILED DESCRIPTION EXEMPLARY EMBODIMENTS

The advantages and features of the inventive concept and methods of achieving the advantages and features will be described more fully with reference to the accompanying drawings, in which exemplary embodiments are shown. The inventive concept may, however, be embodied in many different forms and should not be construed as being limited to the embodiments set forth herein; rather these embodiments are provided so that this disclosure will be thorough and complete, and will fully convey the inventive concept to one of ordinary skill in the art. Meanwhile, the terminology used herein is for the purpose of describing particular embodiments only and is not intended to be limiting of inventive concept. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof. It will be understood that, although the terms first, second, etc. may be used herein to describe various elements, these elements should not be limited by these terms. These terms are only used to distinguish one element from another.

Figure 1A:
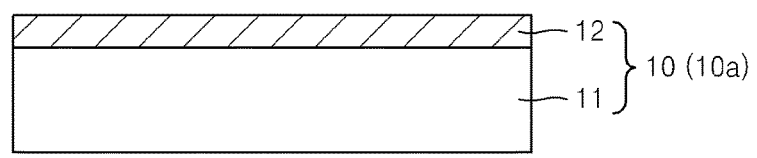
FIGS. 1A and 1B are cross-sectional views illustrating a substrate including a metal thin film according to an exemplary embodiment.
Figure 1B:
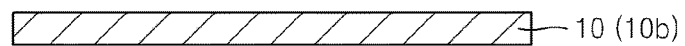

Herein, "a substrate including a metal thin film (hereinafter, referred to as a substrate)" 10 may be a substrate 10a which includes a base layer 11 and a metal thin film layer 12 formed on a base layer 11 as shown in FIG. 1A, or may be a substrate 10b which is a single layer as shown in FIG. 1B.

Referring to FIG. 1A, if the substrate 10 is the substrate 10a including the base layer 11 and the metal thin film layer 12 formed on the base layer 11, the base layer 11 may be formed of an inorganic material such as silicon (Si), glass, GaN, or silica, or a metal such as nickel (Ni), copper (Cu), or tungsten (W). Alternatively, the base layer 11 may be formed of $SiO_2$, $Si_3N_4$, SiON, SIOF, BN, hydrogen silsesquioxane (HSQ), xerogel, aero gel, poly naphthalene, amorphous carbon fluoride (a-CF), SiOC, MSQ, black diamond, or the like.

The metal thin film layer 12 may be formed on the base layer 11 by using a sputtering device, an electron beam evaporation device, or the like. The metal thin film layer 12 may include at least one metal selected from the group consisting of nickel (Ni), cobalt (Co), iron (Fe), platinum (Pt), gold (Au), silver (Ag), aluminum (Al), chromium (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), palladium (Pd), yttrium (Y), and zirconium (Zr).

Referring to FIG. 1B, the substrate 10b, which includes a single metal thin film, may include a metal selected from the group consisting of Ni, Co, Fe, Pt, Au, Ag, Al, Cr, Cu, Mg, Mn, Mo, Rh, Si, Ta, Ti, W, U, V, Pd, Y, and Zr.

A case where a substrate includes a single metal thin film will be explained for convenience.

Figure 2:
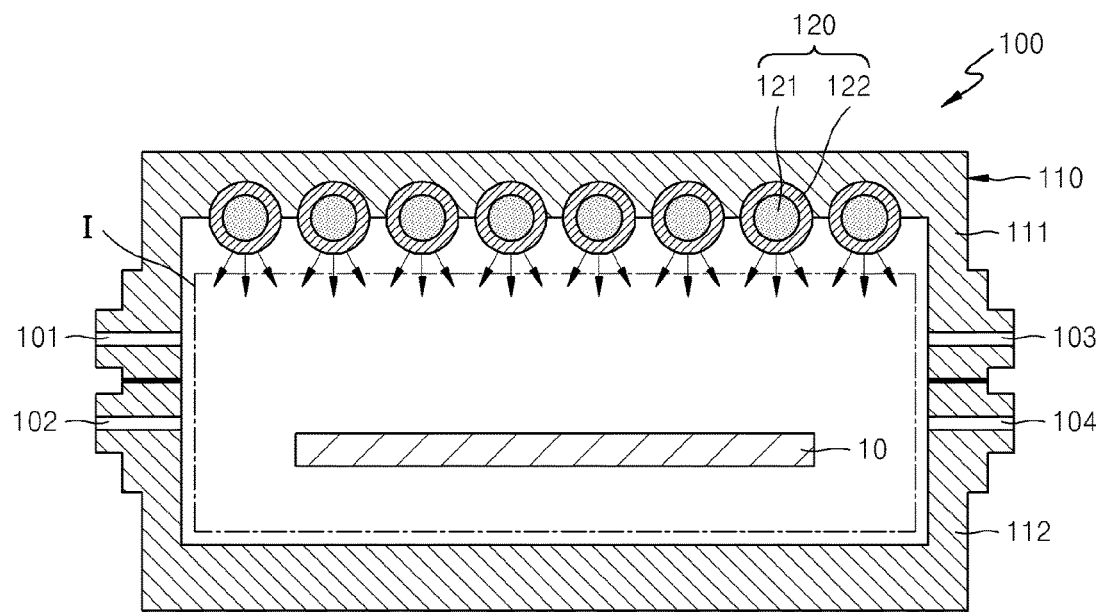
FIG. 2 is a cross-sectional view illustrating a graphene synthesis chamber according to an exemplary embodiment.

FIG. 2 is a cross-sectional view illustrating a graphene synthesis chamber 100 according to an exemplary embodiment.

Referring to FIG. 2, the graphene synthesis chamber 100 includes a chamber case 110 and a main heating unit 120.

The chamber case 110 defines an inner space I in which the substrate 10 may be placed. For example, the chamber case 110 may include a first chamber case 111 which is an upper case and a second chamber case 112 which is a lower case, and the inner space I may be formed between the first and second chamber cases 111 and 112. A stage (not shown) on which the substrate 10 is placed may be disposed in the inner space I.

The graphene synthesis chamber 100 may include a first depressurization unit 101 or a second depressurization unit 103 in order to depressurize the inner space I. Alternatively, the graphene synthesis chamber 100 may include both the first and second depressurization units 101 and 103. In this case, the first depressurization unit 101 may be disposed at a first side and the second depressurization unit 103 may be disposed at a second side opposite to the first side. The inner space I of the graphene synthesis chamber 100 may be depressurized to a pressure of about several hundred torr to about $10^{-3}$ torr by discharging a gas in the inner space I to the outside through the first and second depressurization units 101 and 103.

A gas supply unit 102 is disposed on a first side of the graphene synthesis chamber 100, and supplies a gas including carbon into the inner space I. The gas including carbon, which is a reactive gas for forming graphene, may be at least one selected from the group consisting of carbon monoxide (CO), carbon dioxide ($CO_2$), ethane ($C_2H_6$), ethylene ($CH_2$), ethanol ($C_2H_5$), acetylene ($C_2H_2$), propane ($CH_3CH_2CH_3$), propylene ($C_3H_6$), butane ($C_4H_{10}$), butadiene ($C_4H_6$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), and toluene ($C_7H_8$).

Meanwhile, the gas supply unit 102 may supply not only the gas including carbon but also an atmospheric gas into the inner space I. The atmospheric gas may include an inert gas such as helium or argon, and a non-reactive gas such as hydrogen for maintaining a surface of the metal thin film clean.

Although the gas supply unit 102 supplies the gas including carbon and the atmospheric gas in FIG. 2, the present embodiment is not limited thereto. For example, a gas supply unit for supplying a gas including carbon and a gas supply unit for supplying an atmospheric gas may be separately disposed, and may respectively supply the gas including carbon and the atmospheric gas into the inner space I.

A gas discharge unit 104 is disposed on a second side of the graphene synthesis chamber 100 opposite to the first side, and discharges remaining gases left after being used to synthesize graphene in the inner space I to the outside. According to an exemplary embodiment, the gas discharge unit 104, instead of the first and second depressurization units 101 and 103, may be used to discharge a gas in the inner space I to the outside before the atmospheric gas and the gas including carbon are supplied into the inner space I.

The main heating unit 120 emits light having a near-infrared wavelength band into the inner space I. The light having the near-infrared wavelength band may mainly heat the substrate 100. The light having the near-infrared wavelength band may be directly emitted to the substrate 10 to uniformly increase a temperature of the substrate 10 and rapidly reach a temperature needed to synthesize graphene.

If an inner space of a chamber is heated by using an inductor coil, since the entire inner space of the chamber is heated, it takes a long time to reach a temperature needed to synthesize graphene, and it also takes a long time to reduce the temperature after the graphene is synthesized. Meanwhile, since the graphene synthesis chamber 100 uses light having a near-infrared wavelength band, a temperature may be easily controlled, the substrate 100 may be rapidly heated to a temperature needed to synthesize graphene without heating the entire inner space I, and a temperature may be uniformly increased irrespective of a position of the substrate 10.

The main heating unit 120 may emit light having at least one of a mid-infrared wavelength band and a visible wavelength band as well as the light having the near-infrared wavelength band. The light having the mid-infrared wavelength band or the visible wavelength band may heat the gas including carbon supplied into the graphene synthesis chamber 100.

Since the light having the near-infrared wavelength band heats the substrate 10, and the light having the mid-infrared wavelength band and the visible wavelength band heats the gas including carbon, temperatures of outer walls of the first and second chamber cases 111 and 112 may be lower than a temperature of the substrate 10. That is, since only the substrate 10 and surroundings of the substrate 10 are heated without heating the entire graphene synthesis chamber 100, a temperature needed to synthesize graphene may efficiently be controlled. Since a time taken to increase a temperature to a temperature needed to synthesize graphene and a time to reduce the temperature are reduced in this configuration, graphene may be mass produced.

Also, compared to the aforesaid chamber having the inner space which is heated by using the inductor coil, the graphene synthesis chamber 100 may minimize unnecessary substances, for example, impurities, deposited on an outer wall or a pipe of the graphene synthesis chamber 100.

The main heating unit 120 may include lamps 121 and windows 122. The plurality of lamps 121 may be spaced apart from one another. The lamps 121 may be halogen lamps. The halogen lamps emit light having a near-infrared wavelength band, a mid-infrared wavelength band, and/or a visible wavelength band.

The windows 122 may be formed of a transparent material such as quartz, and may surround outer circumferential surfaces of the lamps 121. The windows 112 may protect the lamps 121 and may improve luminous efficiency.

A process of synthesizing graphene in the graphene synthesis chamber 100 described above will now be explained.

First, the substrate 10 is placed in the inner space I, and then, a gas in the inner space I is discharged to the outside through the first and second depressurization units 101 and 103 by using a vacuum pump (not shown). A pressure in the inner space I may be of about several hundred torr to about $10^{-6}$ torr.

Next, an atmospheric gas may be injected into the inner space I through the gas supply unit 102. The atmospheric gas may be an inert gas such as helium or argon, and/or a non-reactive gas such as hydrogen for maintaining the surface of the metal thin film clean.

After the atmospheric gas is injected, the substrate 10 is heated by using the main heating unit 120, and a gas including carbon, that is, a reactive gas, is supplied through the gas supply unit 102 when a temperature of the substrate 10 is sufficiently high.

When the substrate 10 is heated due to light having a near-infrared wavelength band emitted from the main heating unit 120, a temperature of the substrate 10 is increased. Due to the increase in the temperature of the substrate 10, temperatures of surroundings of the substrate 10 also locally increase, and thus, thermal energy is supplied to the gas including carbon. Also, since thermal energy is supplied to the gas including carbon due to light having a visible wavelength band and/or a mid wavelength band emitted from the main heating unit 120, a condition needed to synthesize graphene is rapidly achieved. For example, the gas including carbon may be decomposed such that the gas including carbon is absorbed into the metal thin film.

Figure 3:
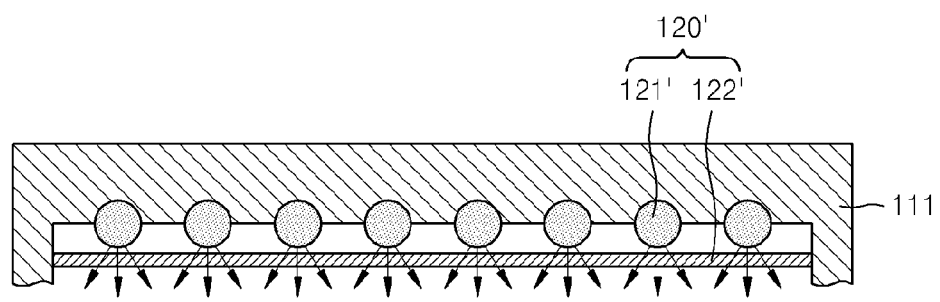
FIG. 3 is a cross-sectional view illustrating a main heating unit modified from a main heating unit of the graphene synthesis chamber of FIG. 2, according to an exemplary embodiment.

FIG. 3 is a cross-sectional view illustrating a main heating unit 120' modified from the main heating unit 120 of the graphene synthesis chamber 100 of FIG. 2, according to an exemplary embodiment.

Referring to FIG. 3, the main heating unit 120' may include lamps 121' that are spaced apart from one another at predetermined intervals, and a window 122' that is disposed adjacent to the lamps 121' in a direction (hereinafter, referred to as a light emission direction) in which the lamps 121' emit light. The windows 122 of FIG. 2 surround the outer circumferential surfaces of the lamps 121, and the window 122' of FIG. 3 is disposed beside the lamps 121' that are aligned at predetermined intervals. According to another according to an exemplary embodiment, the intervals between the lamps 121' may not be the same and may be adjusted to increase an overall efficiency of light emitted from the lamps 121'. This embodiment may apply to the other structures of a main heating unit of a graphene synthesis chamber described in the present application.

Figure 4:
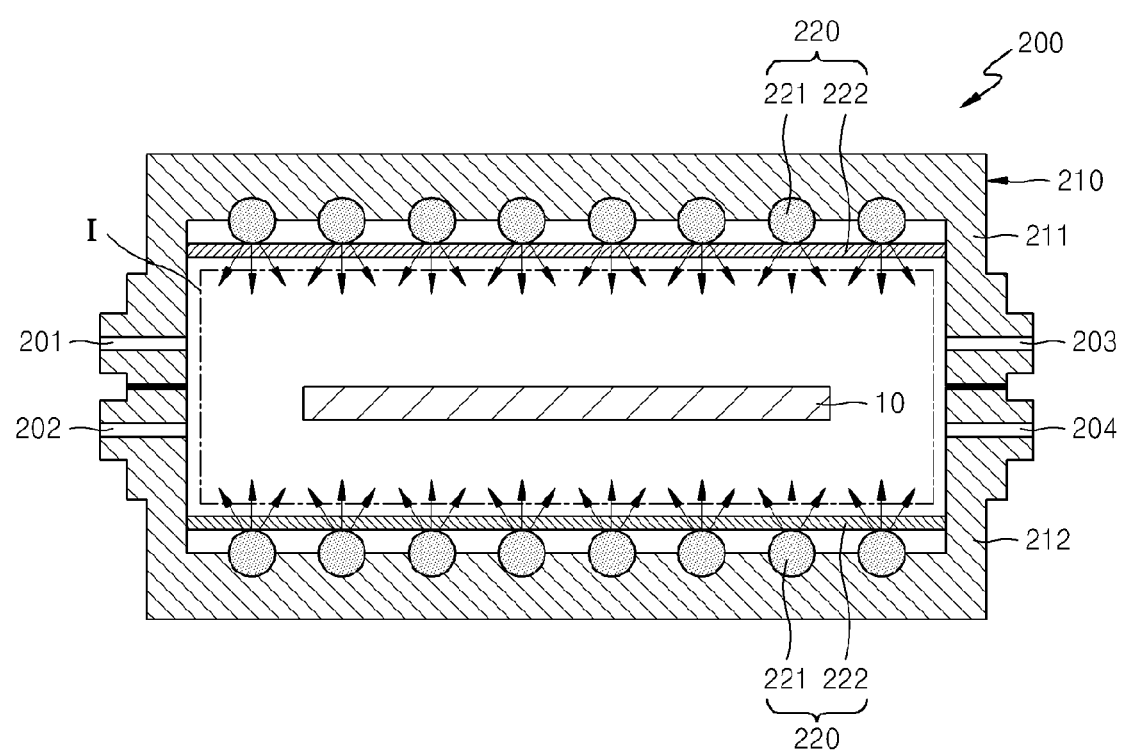
FIG. 4 is a cross-sectional view illustrating a graphene synthesis chamber according to another exemplary embodiment.

FIG. 4 is a cross-sectional view illustrating a graphene synthesis chamber 200 according to another exemplary embodiment.

Referring to FIG. 4, the graphene synthesis chamber 200 includes a chamber case 210 and main heating units 220, first and second depressurization units 201 and 203 for depressurizing an inner space I of the chamber case 210, and a gas supply unit 202 and a gas supply discharge unit 204 for respectively introducing and discharging a gas including carbon and an atmospheric gas needed to synthesize graphene, like the graphene synthesis chamber 100 of FIG. 2, and thus, an explanation thereof will not be given.

However, the graphene synthesis chamber 200 is different from the graphene synthesis chamber 100 in that the main heating units 220 are disposed over and under the substrate 10.

The main heating units 220 each including lamps 221 and a window 222 are disposed over and under the substrate 10. The main heating units 220 may each include the lamps 221 and the window 222. The lamps 221 may be halogen lamps. The halogen lamps may emit light having a near-infrared wavelength band, a mid-infrared wavelength band, and/or a visible wavelength band to the top and the bottom of the substrate 10.

Since light is simultaneously emitted from the main heating units 220 that are disposed over and under the substrate 10, a temperature of the substrate 10 may be uniformly increased, and a time taken to increase the temperature may be reduced, thereby reducing a time taken to synthesize graphene. For an overall efficiency, however, the light may not be simultaneously emitted from the main heating unit 220.

Figure 5:
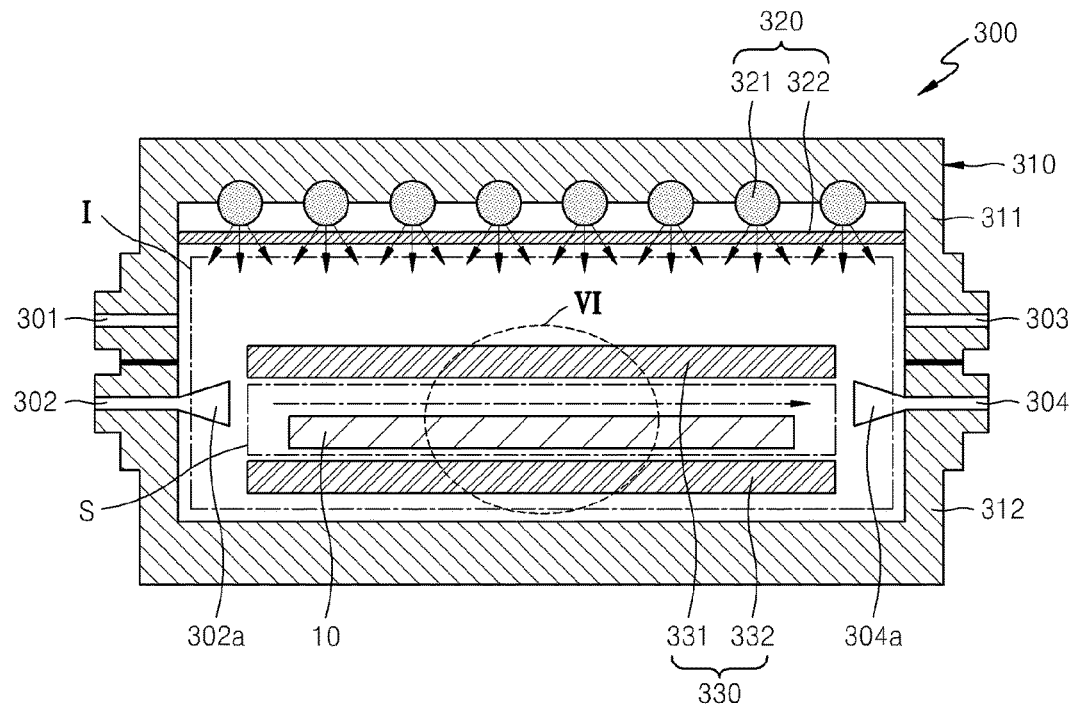
FIG. 5 is a cross-sectional view illustrating a graphene synthesis chamber according to another exemplary embodiment.
Figure 6:
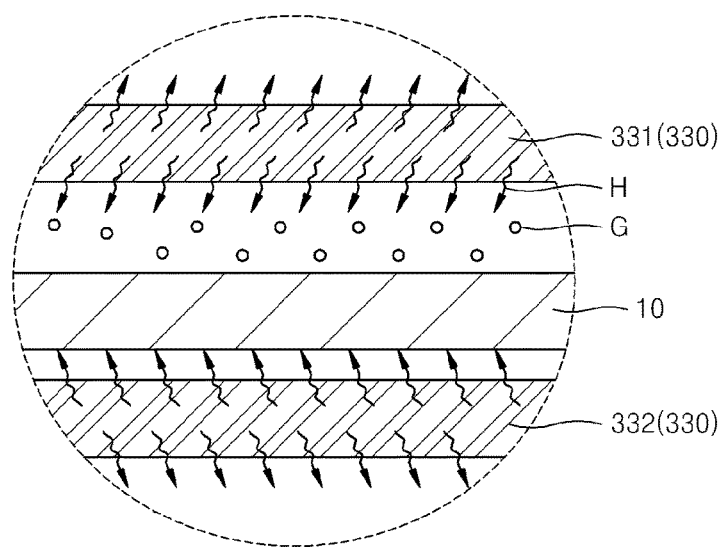
FIG. 6 is an enlarged cross-sectional view illustrating a portion VI of FIG. 5.

FIG. 5 is a cross-sectional view illustrating a graphene synthesis chamber 300 according to another exemplary embodiment. FIG. 6 is a cross-sectional view illustrating a portion VI of FIG. 5.

Referring to FIG. 5, the graphene synthesis chamber 300 includes a chamber case 310, first and second depressurization units 301 and 303 for depressurizing an inner space I of the chamber case 310, a gas supply unit 302 and a gas discharge unit 304 for respectively introducing and discharging a gas including carbon needed to synthesize graphene, and an auxiliary heating unit 330. The following explanation will be made by focusing on the differences between the embodiments.

A main heating unit 320 emits light having a near-infrared wavelength band into the inner space I to mainly heat the substrate 10. The light having the near-infrared wavelength band may be directly emitted to the substrate 10 to uniformly increase a temperature of the substrate 10 and help to rapidly reach a temperature needed to synthesize graphene.

The auxiliary heating unit 330 may face at least one surface of a first surface and a second surface of the substrate 10. For example, the auxiliary heating unit 330 may include a first auxiliary heating portion 331 and a second auxiliary heating portion 332 which are disposed at both sides of the substrate 10.

The first auxiliary heating portion 331 and the second auxiliary heating portion 332 may face each other to be spaced apart from each other, thereby defining an auxiliary space S. For example, the first auxiliary heating portion 331 may face the first surface of the substrate 10 to be spaced apart from the substrate 10, and the second auxiliary heating portion 332 may face the second surface of the substrate 10. The first and second auxiliary heating portions 331 and 332 may be formed such that the auxiliary space S is rapidly optimized to perform graphene synthesis.

Temperatures of the first and second auxiliary heating portions 331 and 332 may increase due to the light having the near-infrared wavelength band emitted from the main heating unit 320. Each of the first and second auxiliary heating portions 331 and 332 may be formed of any material as long as a temperature of the material may increase due to the light having the near-infrared wavelength band. For example, each of the first and second auxiliary heating portions 331 and 332 may include a metal or graphite.

When the substrate 10 is heated due to the light having the near-infrared wavelength band, a temperature of the substrate 10 increases and temperatures of surroundings of the substrate 10 also locally increase due to heat generated by the substrate 10. In this case, the first and second auxiliary heating portions 331 and 332 are disposed around the substrate 10 to contain heat generated in the surroundings of the substrate 10.

Also, since temperatures of the first and second auxiliary heating portions 331 and 332 increase due to the light having the near-infrared wavelength band, a temperature of the auxiliary space S formed around the substrate 10 is higher than temperatures of other spaces of the inner space I. That is, a temperature needed to synthesize graphene may be more rapidly reached due to the first and second auxiliary heating portions 331 and 332.

Since graphene synthesis occurs in the auxiliary space S, a gas including carbon only needs to be supplied into the auxiliary space S. Accordingly, in order to minimize generation or leakage of a gas flowing to spaces other than the auxiliary space S, the gas supply unit 302 may include an extension portion 302a that extends toward the auxiliary space S. According to another exemplary embodiment, however, the gas supply unit 302, without the extension portion 302a, may be disposed such that the gas including carbon is easily supplied into the auxiliary space S, thereby obtaining an effect of extending the gas supply unit 302 toward the auxiliary space S.

The gas discharge unit 304 that discharges remaining gases left after the graphene synthesis also includes an extension portion 304a to rapidly discharge the remaining gases, thereby maintaining the auxiliary space S in an optimal state needed to synthesize graphene. According to another exemplary embodiment, however, the gas discharge unit 304, without the extension portion 304a, may be disposed such that the remaining gases are easily discharged, thereby obtaining an effect of extending the gas discharge unit 304 toward the auxiliary space S.

Although the main heating unit 320 is disposed only over the substrate 10 in FIG. 5, the present embodiment is not limited thereto. The main heating unit 320 may also be disposed both over and under the substrate 10, like in FIG. 4.

Although one window 322 of the main heating unit 320 faces one side surfaces of lamps 321 in FIG. 5, the main heating unit 320 may also include the lamps 321 and a plurality of the windows 322 surrounding outer circumferential surfaces of the lamps 321 like in FIG. 2.

A process of synthesizing graphene in the graphene synthesis chamber 300 constructed as described above will now be explained.

First, the substrate 10 is placed in the inner space I, and then, a gas in the inner space I is discharged to the outside through the first and second depressurization units 301 and 303 by using a vacuum pump (not shown). A pressure in the inner space I may be of about several hundred torr to about $10^{-6}$ torr which is lower than an atmospheric pressure.

Next, an atmospheric gas, for example, an inert gas such as helium or argon and/or a non-reactive gas such as hydrogen for maintaining the surface of the metal thin film clean, may be injected through the gas supply unit 302. In this case, since by using the extension portion 302a or positioning of the gas supply unit 302, the atmospheric gas may be efficiently supplied into the auxiliary space S.

After the atmospheric gas is injected, the substrate 10 and the first and second auxiliary heating portions 331 and 332 are heated by using the main heating unit 320. Referring to FIG. 6, when temperatures of the substrate 10 and the first and second auxiliary heating portions 331 and 332 sufficiently increase due to light having a near-infrared wavelength band emitted from the main heating unit 320, a temperature of the auxiliary space S increases due to heat generated by the substrate 10 and the first and second auxiliary heating portions 331 and 332 to a temperature high enough to synthesize graphene. For example, temperatures of the auxiliary space S and the substrate 10 may be about 1000° C. or higher.

Next, a gas including carbon, that is, a reactive gas G, is supplied through the gas supply unit 302. In this case, by using the extension portion 304a or positioning of the gas supply unit 304, the reactive gas G flows efficiently from the gas supply unit 302 through the auxiliary space S to the gas discharge unit 304. The reactive gas G is supplied along with the thermal energy in the auxiliary space S, and thus, is decomposed to synthesize graphene.

When the reactive gas G passes through the auxiliary space S having a high temperature, the reactive gas G contacts the substrate 10, that is, an activated surface of the metal thin film. The reactive gas G decomposed in this process is absorbed into the metal thin film having the activated surface to grow graphene crystals.

Although the substrate 10 is heated by the main heating unit 320, and then, a gas including carbon is supplied in FIG. 5, the present embodiment is not limited thereto. For example, before the main heating unit 320 emits light, when the main heating unit 320 emits light, or after the main heating unit 320 emits light, a gas including carbon may be supplied. That is, the main heating unit 320 may operate before a gas including carbon is supplied, the main heating unit 320 may operate while a gas including carbon is supplied, or the main heating unit 320 may operate after a gas including carbon is supplied.

Although the substrate 10 and the first and second auxiliary heating portions 331 and 332 are heated due to light having a near-infrared wavelength band emitted from the main heating unit 320, the auxiliary space S is heated by the substrate 10 and the first and second auxiliary heating portions 331 and 332 emitting heat H, and a gas including carbon, that is, a reactive gas G, is decomposed in FIG. 5, the present embodiment is not limited thereto. Alternatively, the main heating unit 320 may emit not only light having a near-infrared wavelength band but also light having a mid-infrared wavelength band and/or a visible wavelength band.

In this case, the light having the near-infrared wavelength band emitted from the main heating unit 320 may supply energy to the substrate 10 and the first and second auxiliary heating portions 331 and 332, and the auxiliary space S may be heated by the substrate 10 and the first and second auxiliary heating portions 331 and 332. At the same time, the light having the mid-infrared wavelength band and/or the visible wavelength band emitted from the main heating unit 320 may heat the gas including carbon supplied into the auxiliary space S.

In other words, the gas including carbon may be decomposed by receiving energy from heat of the auxiliary space S heated by the substrate 10 and the first and second auxiliary heating portions 331 and 332, and from light having a mid-infrared wavelength band and/or a visible wavelength band. Accordingly, graphene synthesis may more actively and rapidly occur in the auxiliary space S.

Figure 7:
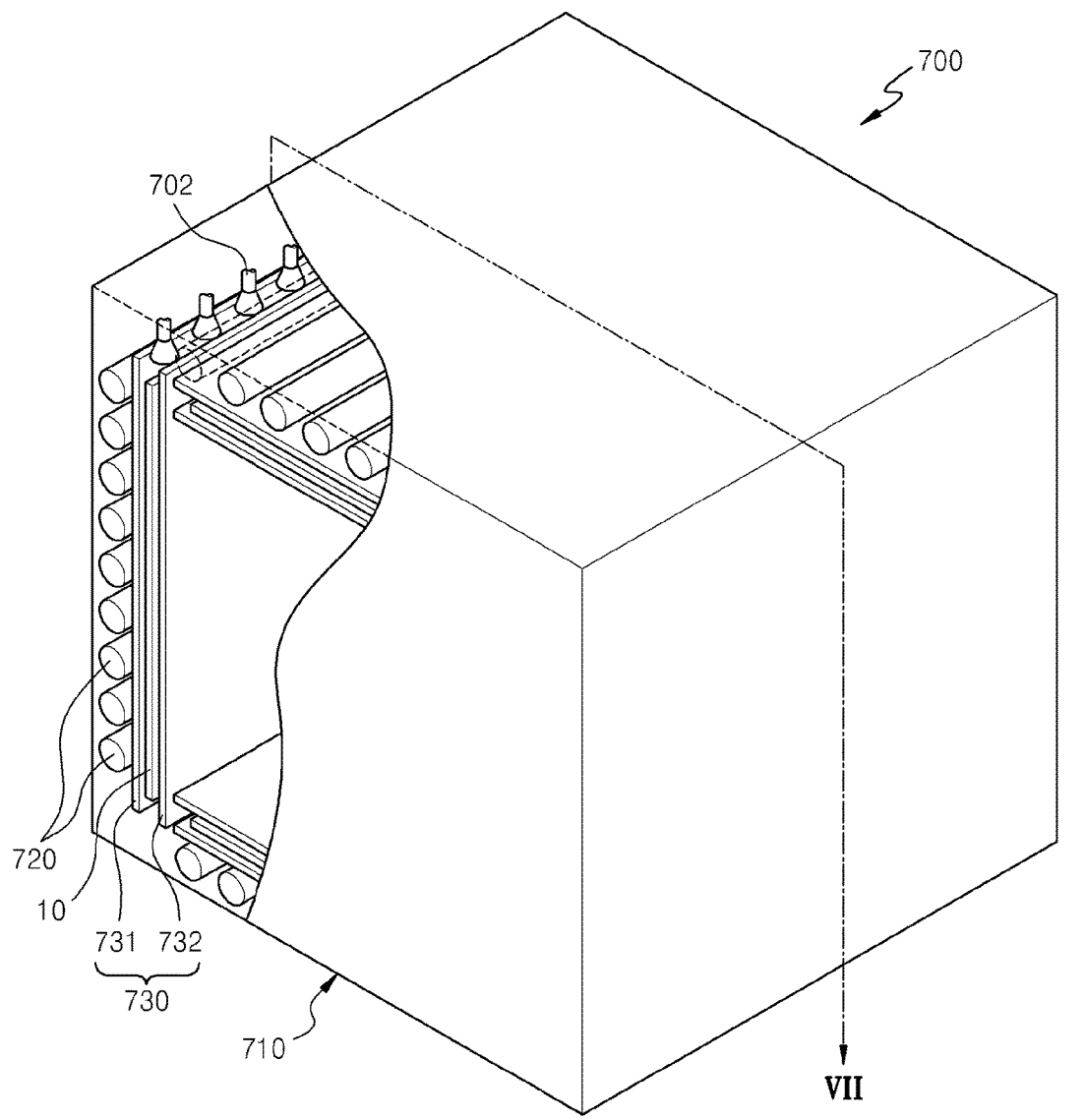
FIG. 7 is a perspective view illustrating a part of a graphene synthesis chamber according to another exemplary embodiment.
Figure 7:
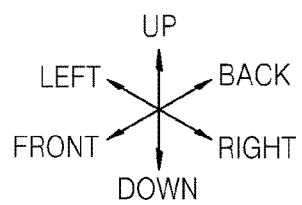
Figure 8:
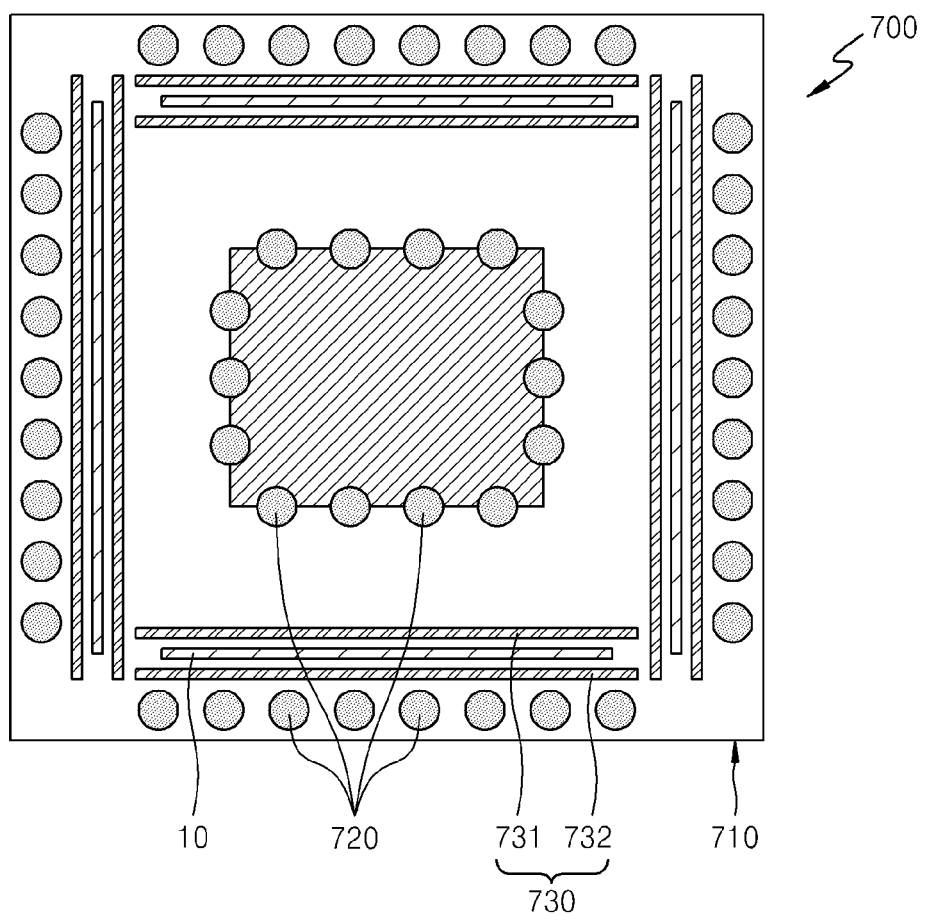
FIG. 8 is a cross-sectional view taken along line VII-VII of FIG. 7.

FIG. 7 is a perspective view illustrating a part of a graphene synthesis chamber 700 according to another exemplary embodiment. FIG. 8 is a cross-sectional view taken along line VII-VII of FIG. 7, according to an exemplary embodiment. First and second depressurization units for depressurizing a chamber case 710 are not shown for convenience of explanation in FIGS. 7 and 8.

The chamber case 710 of the graphene synthesis chamber 700 may be a polyhedron. For example, the chamber case 710 may be a polyhedron including a plurality of surfaces such as a hexahedron or an octahedron. Graphene synthesis may occur in regions corresponding to inner surfaces of the chamber case 710.

Referring to FIG. 7, the graphene synthesis chamber 700, that is, the chamber case 710, may be a hexahedron. Auxiliary heating units 730 may be disposed parallel to inner surfaces of the chamber case 710. For example, the auxiliary heating units 730 may be disposed along four inner surfaces in a front-and-back direction and in a left-and-right direction of the chamber case 710, may be disposed along two inner surfaces in an up-and-down direction of the chamber case 710, or may be disposed along all of six inner surfaces of the chamber case 710.

Each of the auxiliary heating units 730 disposed along inner surfaces of the graphene synthesis chamber 700 may include a first auxiliary heating portion 731 and a second auxiliary heating portion 732 which are disposed at both sides of the substrate 10. The first auxiliary heating portion 731 and the second auxiliary heating portion 732 face each other to be spaced apart from each other, thereby defining an auxiliary space therebetween. The substrate 10 is disposed between the first and second auxiliary heating portions 731 and 732 that are spaced apart from each other.

Temperatures of the first and second auxiliary heating portions 731 and 732 increase due to light having a near-infrared wavelength band emitted from a main heating unit 720. Each of the first and second auxiliary heating portions 731 and 732 may be formed of any material as long as a temperature of the material may increase due to the light having the near-infrared wavelength band. For example, each of the first and second auxiliary heating portions 731 and 732 may include a metal or graphite.

When the substrate 10 is heated due to the light having the near-infrared wavelength band, a temperature of the substrate 10 increases and temperatures of surroundings of the substrate 10 also locally increase due to heat generated in the substrate 10. In this case, the first and second auxiliary heating portions 731 and 732 are disposed around the substrate 10 to contain heat generated in the surroundings of the substrate 10. Also, since the first and second auxiliary heating portions 731 and 732 are heated due to the light having the near-infrared wavelength band, a temperature of the auxiliary space formed around the substrate 10 is higher than temperatures of other spaces in the graphene synthesis chamber 700. That is, a temperature needed to synthesize graphene is more rapidly reached by the first and second auxiliary heating portions 731 and 732.

Since graphene synthesis occurs in the auxiliary space, a gas including carbon only needs to be supplied into the auxiliary space. Accordingly, in order to minimize generation or leakage of a gas flowing to spaces other than the auxiliary space, a gas supply unit 702 may include an extension portion that extends toward the auxiliary space, or may be positioned to efficiently supply the gas toward the auxiliary space even without such extension portion.

The gas supply unit 702 is disposed near each auxiliary space to supply a gas including carbon into each auxiliary space. For example, the gas supply unit 702 may extend downward in the chamber case 710 in order to supply a gas including carbon into auxiliary heating units disposed along inner surfaces of the graphene synthesis chamber 700, and may extend laterally in the chamber case 710 in order to supply a gas including carbon into auxiliary spaces formed along a top surface and a bottom surface of the chamber case 710. In this case, a gas discharge unit (not shown) faces the gas supply unit 702 and discharges remaining gases left after graphene synthesis to the outside.

The gas supply unit 102 may supply not only a gas including carbon but also an atmospheric gas into an inner space I. Alternatively, a gas supply unit for supplying a gas including carbon and a gas supply unit for supplying an atmospheric gas may be separately provided, and the gas including carbon and the atmospheric gas may be separately supplied into the chamber case 710.

Referring to FIG. 8, the main heating units 720 emit light having a near-infrared wavelength band into an inner space defined by the chamber case 710 that is a hexahedron. The main heating units 720 may be disposed along a center and inner surfaces of the chamber case 710. The light having the near-infrared wavelength band emitted from the main heating units 720 disposed adjacent to the center and the inner surfaces may mainly heat the substrates 10 and the auxiliary heating units 730 as described above. The light having the near-infrared wavelength band may be directly emitted to the substrates 10 and the auxiliary heating units 730 to uniformly increase temperatures of the substrates 10 and the auxiliary heating units 730 and help to rapidly reach a temperature needed to synthesize graphene.

Alternatively, the main heating units 720 may emit not only the light having the near-infrared wavelength band but also light having at least one of a mid-infrared wavelength band and a visible wavelength band. The light having the mid-infrared wavelength band or the visible wavelength band may heat a gas including carbon supplied into the chamber case 710.

Since the light having the near-infrared wavelength band heats the substrates 10 and the auxiliary heating units 730 and the light having the mid-infrared wavelength band and/or the visible wavelength band heats the gas including carbon, a temperature of an outer wall of the chamber case 710 may be maintained at a level lower than temperatures of the substrates 10. That is, since only the substrates 10 and surroundings of the substrates 10 are heated without heating the entire graphene synthesis chamber 700, a temperature needed to synthesize graphene may be controlled. Since a time taken to increase a temperature to a temperature needed to synthesize graphene, and then, reduce the temperature is reduced in this configuration, graphene may be mass produced.

Meanwhile, when an inside of a chamber is heated by using an inductor coil, since an inner space of the chamber needs to be entirely heated, it takes a long time to reach a temperature needed to synthesize graphene and it takes a long time to reduce the temperature after graphene synthesis. However, the graphene synthesis chamber 700 of FIG. 7 uses light having a near-infrared wavelength band, a temperature may be easily controlled, the substrate 10 may be heated to a temperature needed to rapidly synthesize graphene without heating the entire inner space, and a temperature may be uniformly increased irrespective of a position of the substrate 10 as described above.

Also, since the chamber case 710 of the graphene synthesis chamber 700 includes a plurality of surfaces in FIG. 7, more graphene may be produced during the same time.

Figure 9:
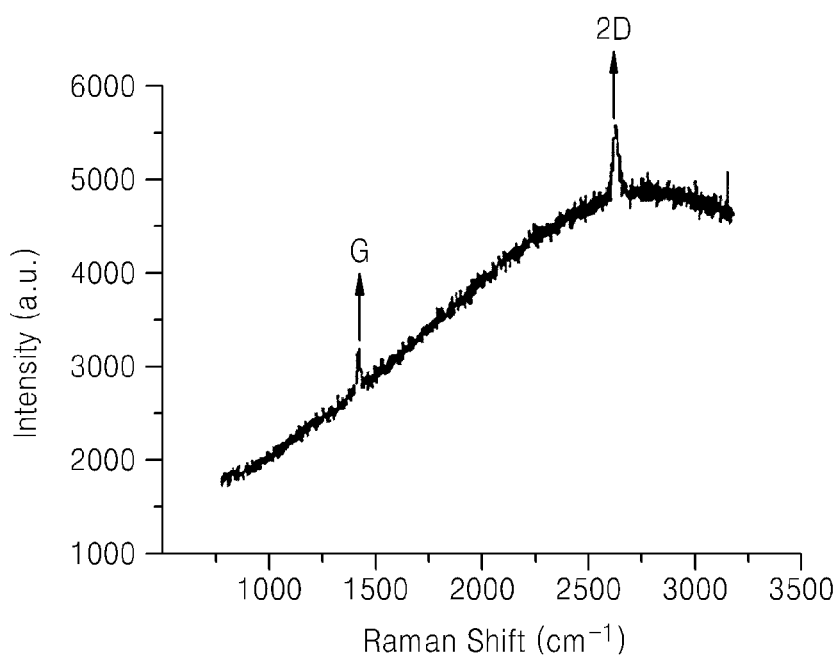
FIG. 9 is a graph illustrating a Raman spectrum of graphene synthesized in the graphene synthesis chamber of FIG. 4, according to an exemplary embodiment.

FIG. 9 is a graph illustrating a Raman spectrum of graphene synthesized in the graphene synthesis chamber 200 of FIG. 4.

Referring to FIG. 9, it is found from a peak G and a peak 2D that a single graphene layer is synthesized.

Figure 10:
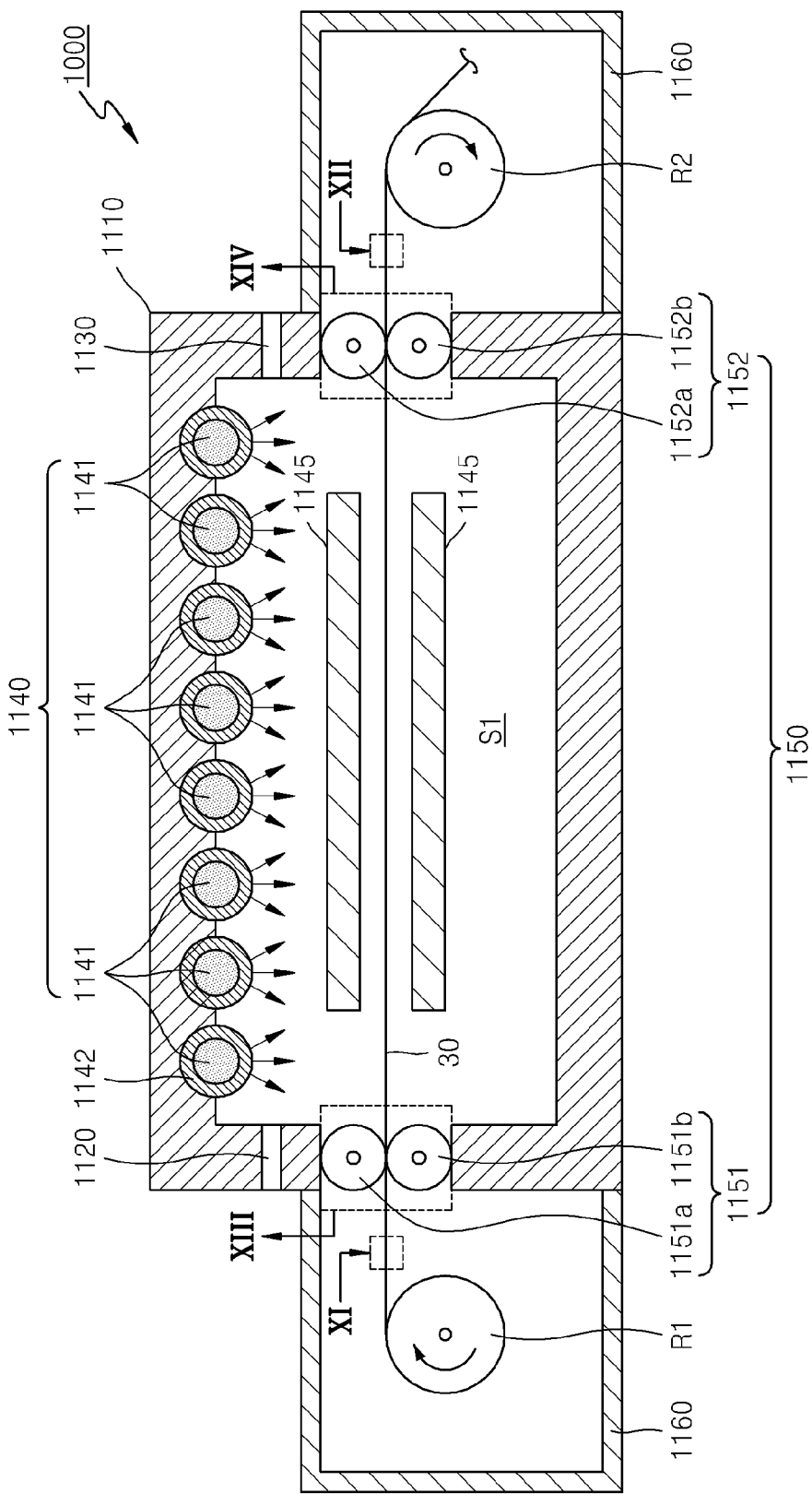
FIG. 10 is a cross-sectional view illustrating a graphene synthesis chamber according to another exemplary embodiment.
Figure 11:
FIG. 11 is a cross-sectional view illustrating a portion XI of a metal thin film of FIG. 10.
Figure 12:
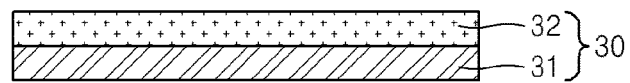
FIG. 12 is a cross-sectional view illustrating a portion XII of graphene formed on the metal thin film of FIG. 10.
Figure 13:
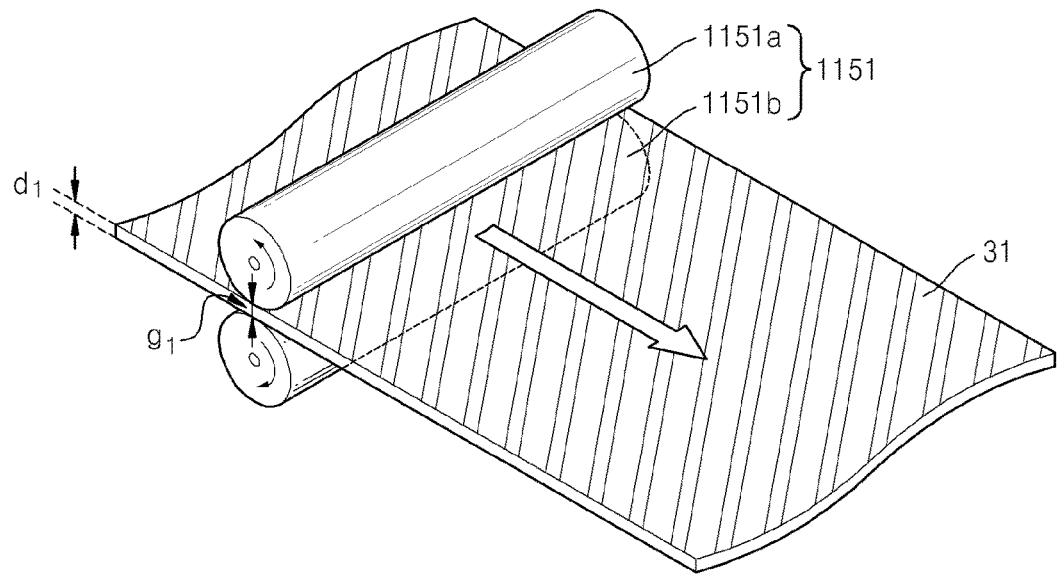
FIG. 13 is a perspective view illustrating a portion XIII of the metal thin film introduced through a metal thin film inlet/outlet of FIG. 10.
Figure 14:
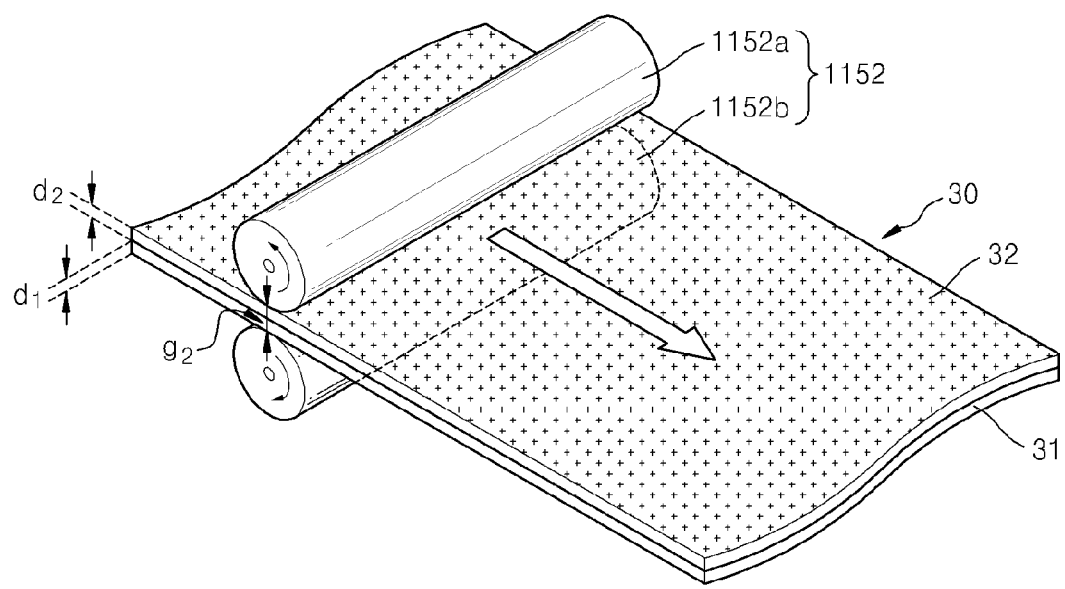
FIG. 14 is a perspective view illustrating a portion XIV of the graphene and the metal thin film discharged through the metal thin film inlet/outlet of FIG. 10.

FIG. 10 is a cross-sectional view illustrating a graphene synthesis chamber 1000 according to another exemplary embodiment. FIG. 11 is a cross-sectional view illustrating a metal thin film 31 corresponding to a portion XI of FIG. 10. FIG. 12 is a cross-sectional view illustrating graphene 32 formed on the metal thin film 31 corresponding to a portion XII of FIG. 10. FIG. 13 is a perspective view illustrating the metal thin film 31 introduced through a metal thin film inlet/outlet unit 1150 corresponding to a portion XIII of FIG. 10. FIG. 14 is a perspective view illustrating the graphene 32 and the metal thin film 31 discharged through the metal thin film inlet/outlet unit 1150 corresponding to a portion XIV of FIG. 10.

Referring to FIG. 10, the graphene synthesis chamber 1000 includes a chamber case 1110 for defining a graphene synthesis space, a gas supply unit 1120, a gas discharge unit 1130, a main heating unit 1140, and a metal thin film inlet/outlet unit 1150.

An inner space of the chamber case 1110 includes a space S1 in which the graphene 32 (see FIG. 12) is synthesized in a roll-to-roll manner on the metal thin film 31 (see FIG. 12).

The gas supply unit 1120 and the gas discharge unit 1130 may be disposed in the chamber case 1110.

The gas supply unit 1120 supplies a gas including carbon (not shown) into the chamber case 1110. The gas including carbon which is a reactive gas for forming the graphene 32 may be at least one selected from the group consisting of methane ($CH_4$), carbon monoxide (CO), ethane ($C_2H_6$), ethylene ($CH_2$), ethanol ($C_2H_5$), acetylene ($C_2H_2$), propane ($CH_3CH_2CH_3$), propylene ($C_3H_6$), butane ($C_4H_{10}$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), and toluene ($C_7H_8$). The gas including carbon is divided into carbon atoms and hydrogen atoms at high temperature.

Also, the gas supply unit 1120 may supply not only a gas including carbon but also an atmospheric gas into the chamber case 1110. The atmospheric gas may include an inert gas such as helium or argon, and a non-reactive gas such as hydrogen for maintaining a surface of the metal thin film 31 clean.

Although only one gas supply unit 1120 is illustrated for convenience, the present embodiment is not limited thereto. For example, a plurality of the gas supply units 1120 may be provided. In this case, an atmospheric gas and a gas including carbon may be separately supplied into the chamber case 1110 through the plurality of gas supply units 1120.

The gas discharge unit 1130 is disposed at a second side of the graphene synthesis chamber 1000, and discharges remaining gases, after being used to synthesize the graphene 32, to the outside. Also, the gas discharge unit 1130 may reduce a pressure in the chamber case 1110 by discharging air in the chamber case 1110 to the outside of the chamber case 1110. In this case, the pressure in the chamber case 1110 may be reduced to about several hundred torr to about $10^{-6}$ torr. Also, the gas discharge unit 1130 may discharge gases, after being used to synthesize the graphene 32, to the outside of the chamber case 1110.

Although only one gas discharge unit 1130 is illustrated for convenience, the present embodiment is not limited thereto. For example, a plurality of the gas discharge units 1130 may be provided. In this case, a gas used to reduce a pressure in the chamber case 1100 and a gas used to synthesize the graphene 32 may be discharged to the outside of the chamber case 1100 through the plurality of different gas discharge units 1130.

The main heating unit 1140 is disposed in the chamber case 1100. The main heating unit 1140 includes a plurality of lamps 1141 that emit radiant heat. The lamps 1041 may be halogen lamps. The lamps 1141 may be surrounded by windows 1142, and the windows 1142 may protect the lamps 1141 and improve luminous efficiency.

A method of synthesizing the graphene 32 (see FIG. 12) on the metal thin film 31 (see FIG. 11) which is a catalyst may include a process of heating an atmospheric gas (hereinafter, referred to as a preheating process), a process of heating a gas including carbon or the metal thin film 31 at a high temperature of at least about 800° C. (hereinafter, referred to as a heating process), and a process of reducing the temperature in order to obtain graphene crystals (hereinafter, referred to as a cooling process). In a conventional method, a CVD device has been used. However, since the CVD device heats not only the metal thin film 31 or a gas in the chamber case 1110 but also the entire chamber case 1110 to appropriate temperatures, both a heating time and a cooling time are long. However, since the main heating unit 1140 of FIG. 10 uses radiant heat, the main heating unit 1140 may rapidly heat the metal thin film 31 or a gas in the chamber case 1110 to a desired temperature, and also reduce a cooling time.

Also, the main heating unit 1140 may emit not only light having a near-infrared (NIR) wavelength band, but also light having a mid-infrared (MIR) wavelength band and/or a visible (IR) wavelength band. Accordingly, the light having the mid-infrared wavelength band and/or the visible wavelength band which mainly increase a temperature of a gas may be mainly used in the preheating process, and the light having the near-infrared wavelength band which increases a temperature of the metal thin film 31 may be mainly used in the heating process. If the light having the mid-infrared wavelength band and/or the light having the near-infrared wavelength band are used in the preheating process, since a temperature of an outer wall of the chamber case 1110 may be maintained at relatively low, a temperature which is one of important factors in mass producing the graphene 32 is reduced, thereby improving productivity. Also, if the light having the near-infrared wavelength band is used in the heating process, the light having the near-infrared wavelength band is directly emitted to the metal thin film 31, a temperature of the metal thin film 31 is uniformly increased, and it takes a short time to reach a temperature needed to synthesize the graphene 32.

Auxiliary heating units 1145 may be disposed to face at least one of a first surface and a second surface of the metal thin film 31. Temperatures of the auxiliary heating units 1145 may increase due to light having a near-infrared wavelength band emitted from the main heating unit 1140. Accordingly, since the auxiliary heating units 1145 trap heat generated around the metal thin film 30, a temperature needed to synthesize the graphene 32 may be achieved more rapidly.

The graphene 32 is synthesized on the metal thin film 31 in a roll-to-roll manner. A first roller R1 around which the metal thin film 31 is wound before the graphene 32 is synthesized, and a second roller R2 around which the metal thin film 31 is wound after the graphene 32 is synthesized are disposed outside the chamber case 1100.

FIG. 11 is a cross-sectional view illustrating the metal thin film 31 disposed outside the chamber case 1110 before the graphene 32 is synthesized. The metal thin film 31 may include at least one metal selected from the group consisting of Ni, Co, Fe, Pt, Au, Ag, Al, Cr, Cu, Mg, Mn, Mo, Rh, Si, Ta, Ti, W, U, V, Pd, Y, and Zr. The metal thin film 31 before the graphene 32 is synthesized is wound around the first roller R1 and is disposed outside the chamber case 1110.

Although the metal thin film 31 is a single layer in FIG. 11, the present embodiment is not limited thereto. The metal thin film 31 may further include a base layer formed of an inorganic material such as Si, glass, GaN, or silica, a metal such as Ni, Cu, or W, $SiO_2$, $Si_3N_4$, SiON, SIOF, BN, HSQ, xerogel, aero gel, poly naphthalene, a-CF, SiOC, MSQ, or black diamond, which is soft enough to be used in a roll-to-roll manner.

FIG. 12 is a cross-sectional view illustrating a graphene structure carried to the outside of the chamber case 1110 after the graphene 32 is synthesized on the metal thin film 31. The metal thin film 31 after the graphene 32 is synthesized is wound around the second roller R2 and is disposed outside the chamber case 1110.

In order to form the graphene 32 on the metal thin film 31 in a roll-to-roll manner, a member for introducing the metal thin film 31 disposed outside the chamber case 1110 into the chamber case 110 and discharging the metal thin film 31 to the outside of the chamber case 1110 after the graphene 32 is completely synthesized is required. To this end, the graphene synthesis chamber 1000 of FIG. 10 includes a metal thin film inlet/outlet unit 1150 formed in the chamber case 1110.

The metal thin film inlet/outlet unit 1150 includes a metal thin film inlet 1151 through which the metal thin film 31 is introduced into the chamber case 1110 from the outside of the chamber case 1110, and a metal thin film outlet 1152 which faces the metal thin film inlet 1151 and through which the metal thin film 31 on which the graphene 32 is completely synthesized is discharged to the outside of the chamber case 1110.

It is preferable, but not necessary, that when the graphene 32 is synthesized, a step of increasing a temperature of an atmospheric gas or a step of heating a gas including carbon to a high temperature is performed in vacuum. However, when the graphene 32 is synthesized, if the first roller R1 and the second roller R2 are located outside the chamber case 1110, vacuum needs to be temporarily removed in order for the metal thin film 31 to pass through the chamber case 1110. To this end, the metal thin film inlet 1151 and the metal thin film outlet 1152 respectively include first and second gaps g1 and g2 (see FIGS. 13 and 14) that close while the chamber case 1110 is maintained in vacuum and open while the graphene 32 is synthesized such that the metal thin film 31 passes through the chamber case 1110, and first and second rotating rollers 1151a, 1151b, 1152a, and 1152b that rotate as the metal thin film 31 moves. According to an exemplary embodiment, only the second gap g2 among the first and second gaps g1 and g2 may be open while the graphene 32 is synthesized such that the metal thin film 31 passes through the chamber case 1110.

Referring to FIG. 13, the first gap g1 is formed at a side of the chamber case 1110 such that the metal thin film 31 wound around the first roller R1 is introduced into the chamber case 1110 to synthesize the graphene 32.

When the graphene 32 is synthesized, the first gap g1 should be greater than at least a thickness d1 of the metal thin film 31. Also, it is preferable, but not necessary, that in order to prevent vacuum from being removed when the graphene 32 is synthesized, the first gap g1 is substantially equal to the thickness d1 of the metal thin film 31.

The first rotating rollers 1151a and 1151b are disposed at both sides of the first gap g1 in order to smoothly move the metal thin film 31 in a roll-to-roll manner.

The metal thin film inlet 1151 includes the first rotating rollers 1151a and 1151b having a torque direction opposite to a movement direction of the metal thin film 31. The first rotating rollers 1151a and 1151b linearly contact the metal thin film 31, thereby minimizing friction with the metal thin film 31 and preventing damage to the metal thin film 31. Also, in order to minimize damage to the metal thin film 31, a portion of the metal thin film inlet 1151 contacting the metal thin film 31 may be formed of a material having a hardness less than that of the metal thin film 31.

Although the metal thin film inlet 1151 includes the first rotating rollers 1151a and 1151b in FIG. 13, the present embodiment is not limited thereto. For example, the metal thin film inlet 1151 may include a plurality of bearings instead of the first rotating rollers 1151a and 1151b, or other various rotating units for smoothly moving the metal thin film 31 and minimizing damage to the metal thin film 31.

Although not shown in detail in FIG. 13, while the chamber case 1110 needs to be maintained in vacuum, the first gap g1 closes. In this case, the first gap g1 may close without using an additional unit. No gap may be formed by disposing an additional buffer device between the first rotating rollers 1151a and 1151b, or vacuum may be maintained by further disposing additional opening/shutting devices at side surfaces of the first rotating rollers 1151a and 1151b.

Referring to FIG. 14, the second gap g2 is formed at a side of the chamber case 1110 such that the graphene structure 30 including the metal thin film 31 on which the graphene 32 is completely synthesized is discharged to the outside of the chamber case 1110. The graphene structure 30 is carried to the second roller R2 disposed outside the chamber case 1110.

The second gap g2 should be greater than at least a sum of the thickness d1 of the metal thin film 31 and a thickness d2 of the graphene 32. Also, it is preferable, but not necessary, that in order to prevent vacuum from being removed while the graphene 32 is synthesized, the second gap g2 is substantially equal to the sum of the thickness d1 of the metal thin film 31 and the thickness d2 of the graphene 32.

The second rotating rollers 1152a and 1152b of the metal thin film outlet 1152 are disposed at both sides of the second gap g2 to smoothly move the graphene structure 30 in a roll-to-roll manner. Although the metal thin film outlet 1152 includes the second rotating rollers 1152a and 1152b, the present embodiment is not limited thereto, and the metal thin film outlet 1152 may be modified in various ways. Also, in order to minimize damage to the metal thin film 31 and the graphene 32, a portion of the metal thin film outlet 1152 contacting the metal thin film 31 may be formed of a material having a hardness less than that of the metal thin film 31.

When the graphene 32 is synthesized, in order to prevent vacuum from being removed due to the first and second gaps g1 and g2, loadlock chambers 1160 may be disposed outside the chamber case 1110 with the first and second gaps g1 and g2 therebetween. The first roller R1 and the second roller R2 may be disposed in the loadlock chambers 1160 disposed at both sides of the chamber case 1110.

Since it is difficult to maintain the tension of a metal thin film at a high temperature because a related art graphene synthesis chamber using CVD is entirely heated, it is also difficult to synthesize graphene in a roll-to-roll manner. However, in a heating method using radiant heat of lamps as in the present embodiment, since a temperature is high but a time taken for the lamps to emit light is reduced, the tension of a metal thin film may be maintained. Accordingly, since graphene may be synthesized in a roll-to-roll manner, the graphene may be mass produced.

A graphene synthesis chamber 1500 according to another exemplary embodiment will be explained with reference to FIG. 15. The same elements are denoted by the same reference numerals and the following explanation will be made by focusing on the differences between the embodiments.

Figure 15:
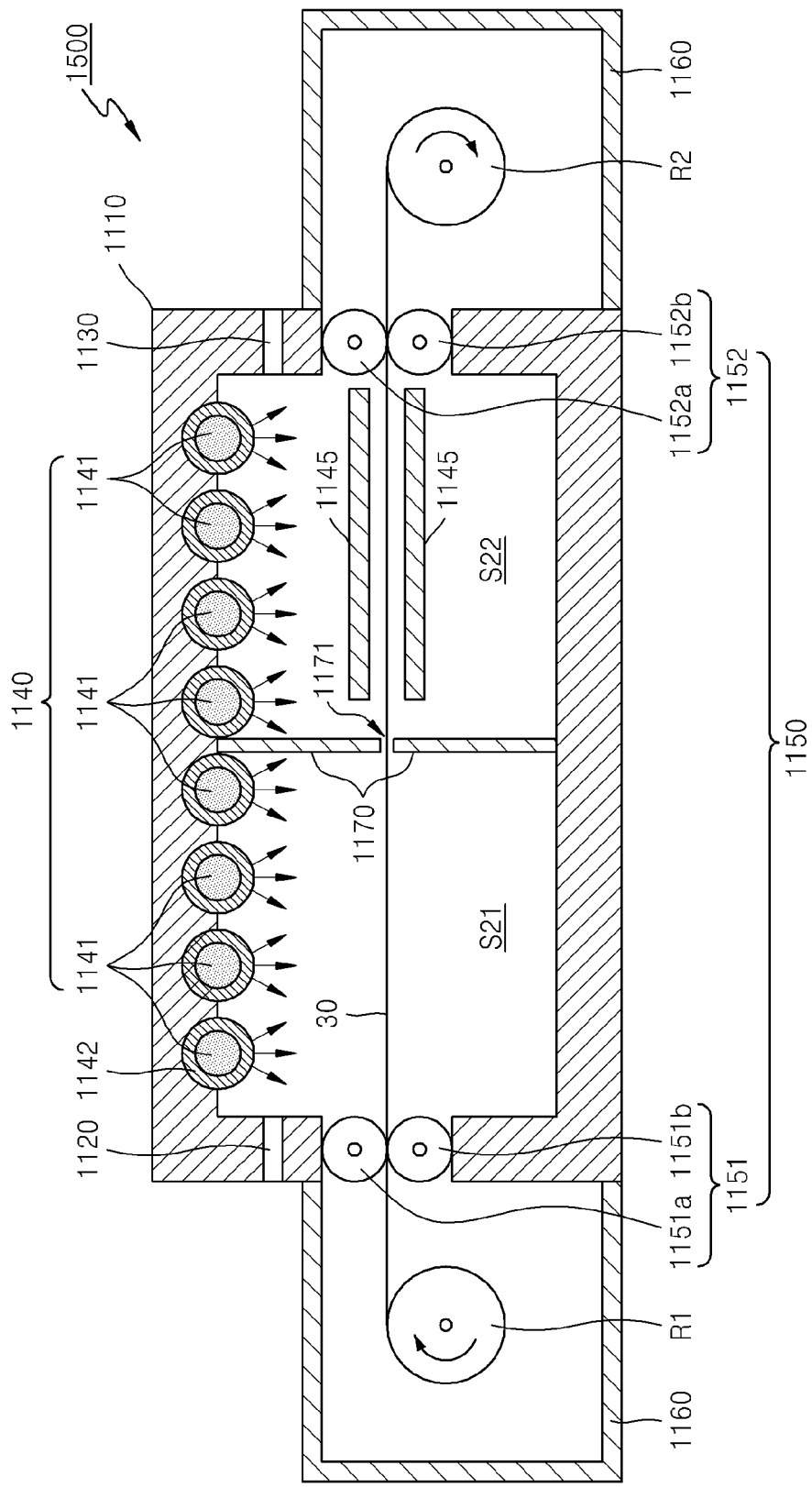
FIG. 15 is a cross-sectional view illustrating a graphene synthesis chamber according to another exemplary embodiment.

FIG. 15 is a cross-sectional view illustrating the graphene synthesis chamber case 1500 according to another exemplary embodiment. Referring to FIG. 15, like in the previous embodiments, the graphene synthesis chamber 1500 includes the chamber case 1110 for defining a graphene synthesis space, the gas supply unit 1120, the gas discharge unit 1130, the main heating unit 1140, and the metal thin film inlet/outlet unit 1150, and also includes a barrier wall 1170 for dividing an inner space of the chamber case 1110.

The inner space of the chamber case 1110 may be divided by the barrier wall 1170 into a space S21 in which an atmospheric gas is heated and a space S22 in which the metal thin film 31 and a gas including carbon are heated. The present embodiment is not limited thereto, and a plurality of the barrier walls 1170 may be provided and a space for performing another function may be further provided. Also, only one process may not be performed in one space. For example, in the space S22 in which the metal thin film 31 and the gas including carbon are heated, not only "a heating process" may be performed but also "a cooling process" for crystallizing the graphene 32 may be performed by turning on or off the main heating unit 1140.

The barrier wall 1170 may further include an opening/shutting portion 1171 for connecting or separating the spaces S21 and S22.

The space S21 in which the atmospheric gas is heated and the space S22 in which the metal thin film 31 and the gas including carbon are heated may use light having different wavelength bands from among light emitted from the main heating unit 1140. For example, the space S21 in which the atmospheric gas is heated may increase a temperature of the atmospheric gas by mainly using light having a mid-infrared wavelength band and/or a visible wavelength band emitted from the main heating unit 1140, and the space S22 in which the metal thin film 31 and the gas including carbon are heated may heat the metal thin film 31 by mainly using light having a near-infrared wavelength band emitted from the main heating unit 1140 and heat the gas including carbon by using light having a mid-infrared wavelength band and/or a visible wavelength band emitted from the main heating unit 1140.

That is, since "a preheating process" and "a heating process" are performed in different spaces and temperatures needed for the preheating process and the heating process are differently set, an overall time of graphene synthesis may be reduced.

In the present embodiment, the auxiliary heating units 1145 may also be disposed in the space S22 in which the metal thin film 31 and the gas including carbon are heated.

A graphene synthesis chamber 1600 according to another exemplary embodiment will be explained with reference to FIGS. 16 through 18. The same elements are denoted by the same reference numerals, and the following explanation will be made by focusing on the differences between the embodiments.

Figure 16:
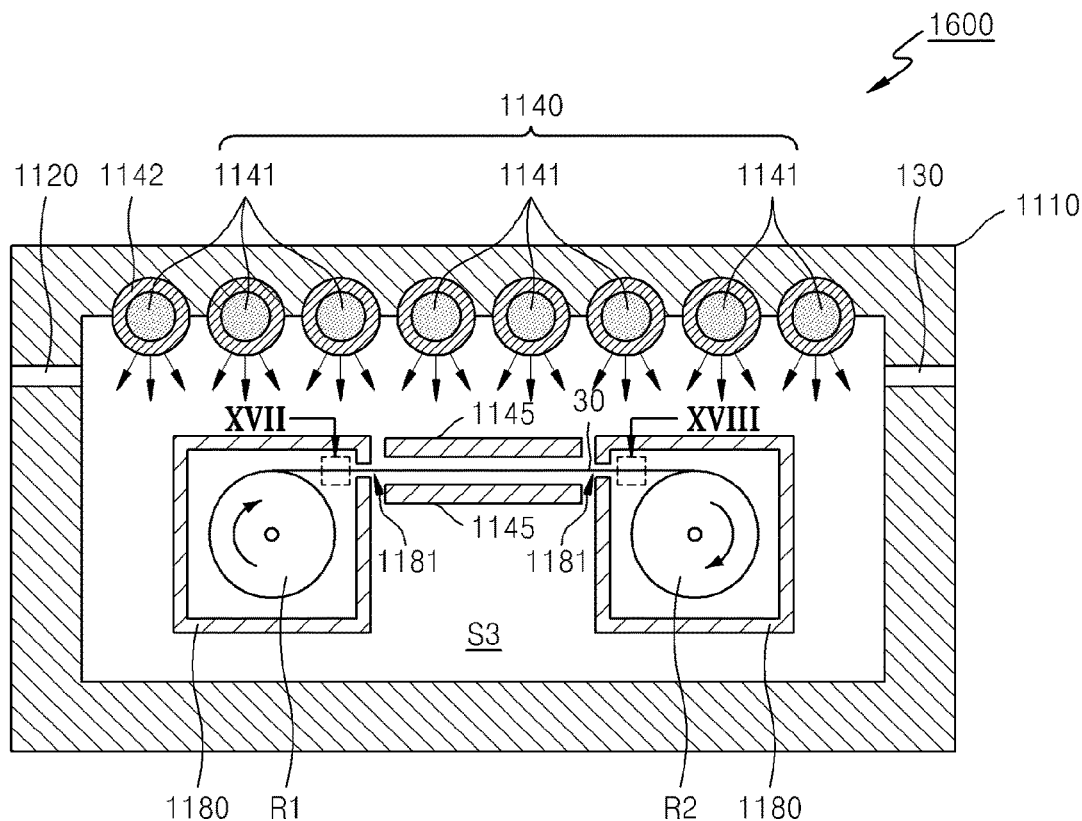
FIG. 16 is a cross-sectional view illustrating a graphene synthesis chamber according to another exemplary embodiment.

FIG. 16 is a cross-sectional view illustrating the graphene synthesis chamber 1600 according to another exemplary embodiment. FIG. 17 is a cross-sectional view illustrating the metal thin film 31 corresponding to a portion XVII of FIG. 16. FIG. 18 is a cross-sectional view illustrating the graphene 32 formed on the metal thin film 31 corresponding to a portion XVIII of FIG. 16.

Figure 17:
FIG. 17 is a cross-sectional view illustrating a portion XVII of a metal thin film of FIG. 16.
Figure 18:
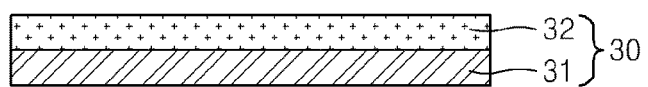
FIG. 18 is a cross-sectional view illustrating a portion XVIII of graphene formed on the metal thin film of FIG. 16.

Referring to FIGS. 16 through 18, the graphene synthesis chamber 1600 includes the chamber case 1110 for defining a graphene synthesis space, the gas supply unit 1120, the gas discharge unit 1130, and the main heating unit 1140, and also includes metal thin film protecting units 1180 disposed in the chamber case 1110.

The graphene 32 is synthesized on the metal thin film 31 in a roll-to-roll manner. The first roller R1 around which the metal thin film 31 is wound before the graphene 32 is synthesized and the second roller R2 around which the metal thin film 31 is wound after the graphene 32 is synthesized are disposed in the chamber case 1110.

Since the metal thin film 31 wound around the first roller R1 and the second roller R2 is disposed in the chamber case 1110, the metal thin film 31 may be damaged due to a gas heated at high temperature when the graphene 32 is synthesized. Accordingly, in order to protect portions of the metal thin film 31 wound around the first and second rollers R1 and R2 and moving in the chamber case 1110 in a roll-to-roll manner when the graphene 32 is synthesized, the metal thin film protecting units 1180 are provided to cover the portions of the metal thin film 31 wound around the first and second rollers R1 and R2.

The metal thin film protecting units 1180 may include inlet/outlets 1181 through which the metal thin film 31 (see FIG. 17) wound around the first roller R1 is discharged to a synthesis space S3 and through which the metal thin film 31 is introduced to the second roller R2 from the synthesis space S3 after the graphene 32 (see FIG. 18) is synthesized.

If the metal thin film protecting units 1180 are evaporated at a temperature lower than a temperature at which the graphene 32 is synthesized, the metal thin film protecting units 1180 may act as impurities when the graphene 32 is synthesized. Accordingly, it is preferable, but not necessary, that the metal thin film protecting units 1180 include a material that evaporates at a temperature higher than the temperature at which the graphene 32 is synthesized.

Accordingly, since the metal thin film 31 of the graphene synthesis chamber 1600 of FIG. 16 is disposed only in the chamber case 1110 unlike in the previous embodiments, vacuum may be maintained even while the graphene 32 is synthesized and thus the graphene 32 may be mass produced more stably.

In this embodiment, the auxiliary heating units 1145 may also be disposed in the space S22 in which the metal thin film 31 and the gas including carbon are heated.

A graphene synthesis chamber 1900 according to another exemplary embodiment will be explained with reference to FIG. 19. The same elements are denoted by the same reference numerals, and the following explanation will be made by focusing on a difference from the graphene synthesis chamber 1600 of FIG. 16.

Figure 19:
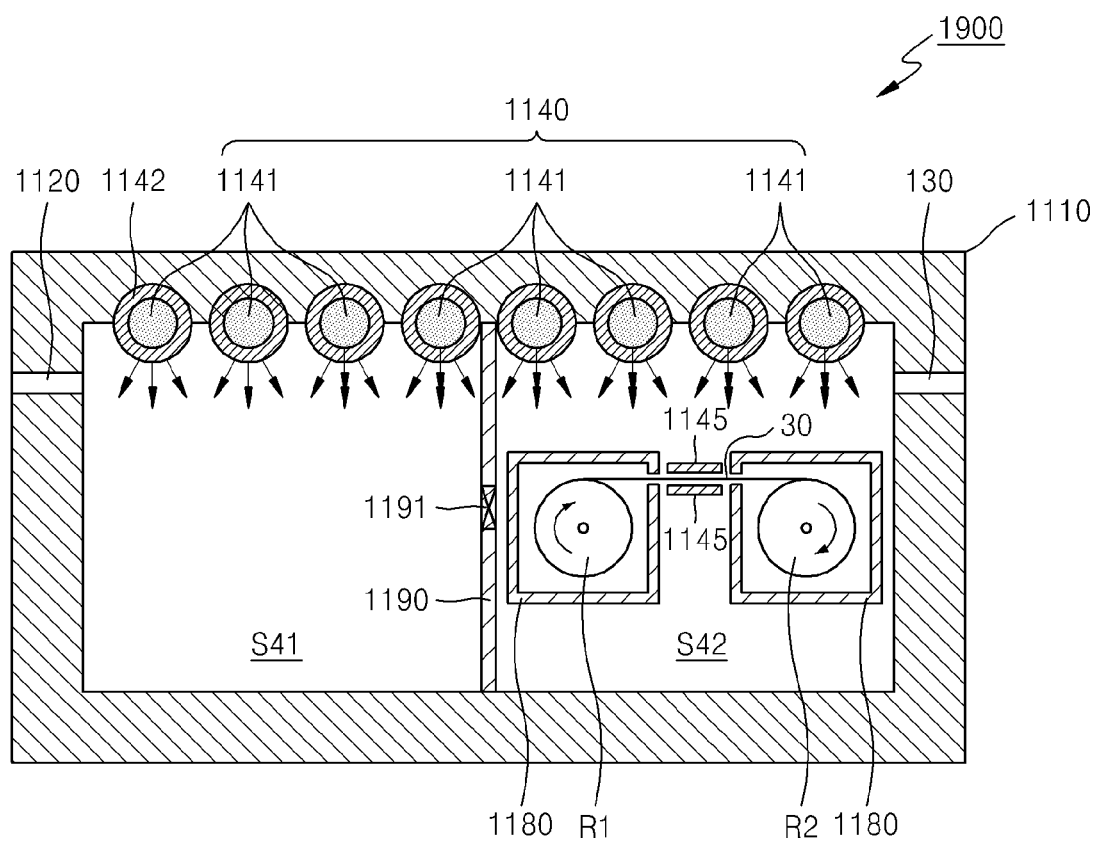
FIG. 19 is a cross-sectional view illustrating a graphene synthesis chamber according to another exemplary embodiment.

FIG. 19 is a cross-sectional view illustrating the graphene synthesis chamber 1900 according to another exemplary embodiment. Referring to FIG. 19, like in the previous embodiments, the graphene synthesis chamber 1900 includes the chamber case 1110 for defining a graphene synthesis space, the gas supply unit 1120, the gas discharge unit 1130, the main heating unit 1140, and the metal thin film protecting units 1180 disposed in the chamber case 1110, and also includes a barrier wall 1190 for dividing an inner space of the chamber case 1110.

The inner space of the chamber case 1110 is divided by the barrier wall 1190 into a space S41 in which an atmospheric gas is heated, and a space S42 in which the metal thin film 31 and a gas including carbon are heated. The present embodiment is not limited thereto, and a plurality of the barrier walls 1190 may be provided and a space for performing another function may be further provided. The barrier wall 1190 may further include an opening/shutting portion 1191 for connecting or separating the spaces S41 and S42.

The metal thin film protecting units 1180 are disposed in the space S42 in which the metal thin film 31 and the gas including carbon are heated to synthesize the graphene 32 in a roll-to-roll manner.

The space S41 which the atmospheric gas is heated and the space S42 in which the metal thin film 31 and the gas including carbon are heated may use light having different wavelength bands from among light emitted from the main heating unit 1140. For example, the space S41 in which the atmospheric gas is heated may increase a temperature of the atmospheric gas by mainly using light having a mid-infrared wavelength band and/or a visible wavelength band of the main heating unit 1140, and the space S42 in which the metal thin film 31 and the gas including carbon are heated may heat the metal thin film 31 by mainly using light having a near-infrared wavelength band of the main heating unit 1140 and heat a temperature of the gas including carbon to a temperature needed to synthesize the graphene 32 by mainly using light having a mid-infrared wavelength band and/or a visible wavelength band of the main heating unit 1140. That is, "a preheating process" and "a heating process" may be performed in different spaces. Since "the preheating process" mainly uses light having a mid-infrared wavelength band or a visible wavelength band, a temperature of the atmospheric gas may rapidly reach an appropriate temperature. Since "the heating process" mainly uses light having a near-infrared wavelength band, temperatures of the metal thin film 31 and the gas including carbon may rapidly reach appropriate temperatures.

Accordingly, since the barrier wall 1190 is provided in the chamber case 1110 and different processes are performed in different spaces by dividing an inner space of the graphene synthesis chamber 1900, an overall time of graphene synthesis may be reduced. Also, since the metal thin film 31 is disposed only in the chamber case 1110, and thus, vacuum may be maintained even while the graphene 32 is synthesized, the graphene 32 may be mass produced more stably.

Even in the present embodiment, the auxiliary heating units 1145 may be disposed in the space S22 in which the metal thin film 31 and the gas including carbon are heated.

As described above, according to the one or more exemplary embodiments, since light having a near-infrared wavelength band is used, a temperature needed to synthesize graphene may be rapidly achieved and a substrate may be uniformly heated.

Also, since auxiliary heating units are provided, a sharp increase in temperature may be prevented, the loss of radiant energy may be minimized, a heating time may be reduced, and graphene synthesis efficiency may be improved.

In addition, since graphene may be synthesized in a roll-to-roll manner, the graphene may be mass produced.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A graphene synthesis method comprising:
   disposing a substrate including a metal thin film in an inner space of a graphene synthesis chamber;
   depressurizing the inner space;
   supplying a gas including carbon into the inner space; and
   irradiating a light to the inner space to heat the substrate using a main heating unit,
   wherein an auxiliary heating unit comprising a graphite which absorbs the light emitted by the main heating unit, and emit radiant heat toward the substrate is disposed between the main heating unit and the substrate,
   wherein the auxiliary heating unit comprises a first auxiliary heating unit which faces a first surface of the substrate, and a second auxiliary heating unit which faces a second surface, opposite to the first surface, of the substrate,
   wherein each of the first auxiliary heating unit and the second auxiliary heating unit is spaced apart from the substrate,
   wherein the main heating unit comprises a first main heating unit and a second main heating unit, and
   wherein the first auxiliary heating unit is disposed between the first main heating unit and the substrate, and the second auxiliary heating unit is disposed between the second main heating unit and the substrate.

2. The graphene synthesis method of claim 1, wherein the supplying a gas including carbon comprises:
   supplying the gas including carbon from a gas supply unit located at a first side of an auxiliary space defined by the first auxiliary heating unit and the second auxiliary heating unit so that the gas including carbon flows along the substrate.

3. The graphene synthesis method of claim 2,
   wherein the gas including carbon supplied from the gas supply unit is discharged to an outside through a gas discharge unit located at a second side opposite to the first side of the auxiliary space.

4. The graphene synthesis method of claim 1, wherein the irradiating a light to the inner space comprises:
   irradiating the light so that a temperature of an auxiliary spaced defined by the first auxiliary heating unit and the second auxiliary heating unit is about 1000 degrees or more.

5. The graphene synthesis method of claim 1, wherein the metal thin film comprises copper.

6. The graphene synthesis method of claim 1, wherein the main heating unit comprises:
   a halogen lamp; and
   a window which is located on a path of light irradiated from the halogen lamp.

7. The graphene synthesis method of claim 1, further comprising before the supplying a gas including carbon,
   supplying an inert gas and a non-reactive gas into the inner space.

* * * * *